(12) United States Patent
Suemitsu et al.

(10) Patent No.: US 6,231,726 B1
(45) Date of Patent: May 15, 2001

(54) PLASMA PROCESSING APPARATUS

(75) Inventors: Toshiyuki Suemitsu, Minoo; Nobuyuki Mori, Yao; Masahide Yokoyama, Hirakata; Masahiro Yamamoto, Osaka, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/471,512

(22) Filed: Dec. 23, 1999

(30) Foreign Application Priority Data

Dec. 28, 1998 (JP) .................................................. 10-371932

(51) Int. Cl.⁷ .................................................. C23C 14/34
(52) U.S. Cl. .............................. 204/192.12; 204/298.09; 204/298.15; 204/298.28; 118/730; 156/345; 427/255.5; 427/569; 216/71
(58) Field of Search ...................... 204/298.09, 298.15, 204/298.28, 192.12, 192.32, 298.32, 298.33; 118/728, 729, 730; 156/345; 427/255.5, 569; 216/71

(56) References Cited

U.S. PATENT DOCUMENTS 3,803,019 * 4/1974 Robinson et al. .............. 204/298.09
4,860,687 * 8/1989 Frijlink .................................. 118/730

FOREIGN PATENT DOCUMENTS

241090 * 11/1986 (DE) .

* cited by examiner

Primary Examiner—Rodney G. McDonald
(74) Attorney, Agent, or Firm—Price and Gess

(57) ABSTRACT

The plasma processing apparatus includes a substrate table 10 that extends from a wall of the vacuum chamber 1 toward the inside of the vacuum chamber 1. A rotary holder 8, to which the substrate 5 is mounted, is arranged in a concave portion 10a that is provided in the substrate table 10. The rotary holder 8 is rotatably supported with its periphery being sealed with a sealing member 10b. Blades 9 are provided inside the rotary holder 8. A supply port 11 and a drainage port 12, for supplying and draining a fluid such that a rotation force is exerted on the blades 9, are formed in the substrate table 10. Supplying a fluid through the supply port 11 cools the substrate 5 while causing it to rotate.

12 Claims, 3 Drawing Sheets

PLASMA PROCESSING APPARATUS

BACKGROUND OF THE INVENTION

1. Field of the Invention

The present invention relates to a plasma processing apparatus, such as a sputtering apparatus for forming a thin film of a target material on a substrate in a vacuum chamber.

2. Description of Prior Art

Conventional sputtering apparatuses have, for example, the following configuration: a target and a substrate are arranged in opposition to each other, a gas for generating a plasma between the two is introduced, a plasma is generated by applying a high frequency or a DC voltage in the cathode portion on which the target is arranged, and ions that are accelerated by the magnetic field collide with the target, so that material is knocked out of the target and deposited on the substrate.

FIG. 3 shows the general configuration of such a sputtering apparatus. In FIG. 3, numeral 21 denotes a vacuum chamber, and numeral 22 denotes a cathode portion. A power source 23 is connected to the cathode portion 22. A target 24 of the material to be vapor-deposited is arranged on the cathode portion 22, and a substrate 25 is arranged in opposition to the target 24. Numeral 26 denotes a gas inlet portion, and numeral 27 denotes an exhaust port. The substrate 25 is attached to a holder 28, which can be rotated with a motor 29. Moreover, cooling water can be introduced to the holder 28 from a cooling water inlet unit 30 and the substrate 25 can be cooled with this cooling water.

With this configuration, a plasma-generating gas, such as argon gas, is introduced from the gas inlet portion 26 into the vacuum chamber 21, and exhausted from the exhaust port 27, so as to attain a predetermined sputtering pressure.

Under a predetermined gas pressure in the vacuum chamber 21, a high frequency or a DC voltage is applied to the cathode portion 22 with the power source 23, thereby generating a plasma between the substrate 25 and the target 24. Argon ions in the plasma are accelerated by the magnetic field and collide with the target 24, so that target material is knocked out and flies off into the vacuum. The target material is thus deposited on the substrate 25, whereby a thin film forms thereon. The holder 28, on which the substrate 25 is held, is rotated by the motor 29 and is cooled by introducing cooling water from a cooling water inlet unit 30.

The substrate 25 needs to be cooled constantly because its temperature rises as the substrate 25 is exposed to the plasma generated between the target 24 and the substrate 25 in proximity to each other during the sputtering. At the same time the substrate 25 needs to be rotated, so as to improve the uniformity of the thin film distribution on the substrate 25.

However, in such a conventional sputtering apparatus as described above, the holder 28 has to be provided with a motor 29 and a cooling water inlet unit 30 to rotate the substrate while cooling it. Therefore, there is the problem that a plurality of mechanical units and the space for installing the same are necessary, which poses a limit to making the sputtering apparatus smaller and simpler.

SUMMARY OF THE INVENTION

With the foregoing drawbacks of the prior art in view, it is an object of the present invention to provide a plasma processing apparatus that can be made smaller and simpler.

A plasma processing apparatus in accordance with the present invention generates a plasma in a vacuum chamber to perform surface processing of a substrate that is placed inside the vacuum chamber. The plasma processing apparatus is furnished with a rotation mechanism for rotating a rotary holder, on which the substrate is placed, using a fluid as a motive force for the rotation. The substrate can be rotated simply by providing means for supplying a fluid to the rotation mechanism, so that the sputtering apparatus can be made smaller and simpler.

If the apparatus is configured such that the substrate on the rotary holder is cooled by the fluid that is also the motive force for the rotation, the rotation and the cooling of the substrate can be achieved by the same means.

The rotation mechanism may comprise a blade that is provided inside the rotary holder, and means for supplying and draining a fluid so that a rotation force is exerted on the blade. The rotation and cooling of the holder can be performed by the fluid while in direct contact with the holder, so that the rotation and cooling of the substrate can be achieved with a simple configuration.

The plasma processing apparatus can further include a substrate table that extends from a wall of the vacuum chamber toward the inside of the vacuum chamber, the rotary holder being arranged in a concave portion that is provided in the substrate table and being rotatably supported with its outer periphery sealed. A blade is provided inside the rotary holder, and ports for supplying and draining a fluid are formed in the substrate table, such that the fluid exerts a rotation force on the blade, which not only simplifies the internal configuration considerably, but lets the ports for supplying and draining the fluid simply open onto the outer face of the vacuum chamber, thereby allowing the entire apparatus to be made smaller and simpler.

If the apparatus further includes a device for adjusting the pressure and flow volume of the fluid, rotation of the substrate at the desired rotating speed can be achieved with a simple configuration, so that the film thickness distribution and other parameters can be controlled easily.

It is preferable for the fluid to be cooling water or He gas.

Moreover, it is especially advantageous for the above construction to be applied to a sputtering apparatus, in which a sputtering target is placed on a cathode portion in the vacuum chamber and a substrate is arranged in opposition to the sputtering target, due to the marked effect of rotating and cooling the substrate accordingly achieved.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

One embodiment of a sputtering apparatus pertaining to the present invention will be hereinafter described with reference to FIGS. 1 and 2.

Figure 1:
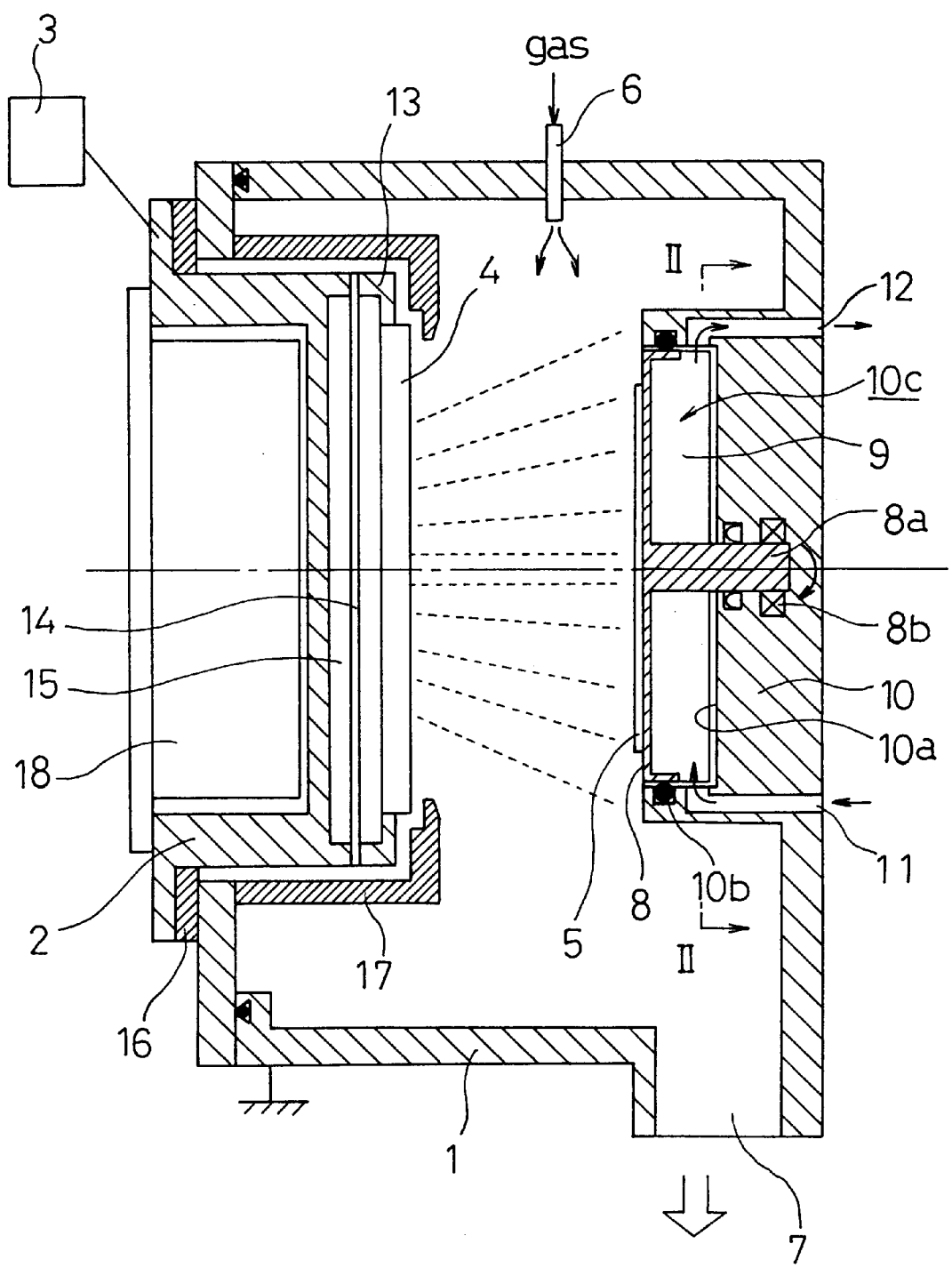
FIG. 1 is a longitudinal cross-sectional view showing the general configuration of a sputtering apparatus in accordance with one embodiment of the present invention.

In FIG. 1, numeral 1 denotes a vacuum chamber, and numeral 2 denotes a cathode portion. A power source 3 is connected to the cathode portion 2, and a target 4 of the material to be vapor-deposited is arranged on the cathode portion 2. A substrate 5 is arranged in opposition to the target 4. Numeral 6 denotes a gas inlet portion, and numeral 7 denotes an exhaust port arranged diagonally with respect to the gas inlet portion 6 in the vacuum chamber 1.

Numeral 8 denotes a rotary holder to which the substrate 5 is attached, and numeral 10 denotes a substrate table, which rotatably supports the rotary holder 8. On the side of the substrate table 10 that faces the target 4, a concave portion 10a is formed, into which the rotary holder 8 is placed. A sealing member 10b for sealing the periphery of the rotary holder 8 is disposed about the circumference of the concave portion 10a, and a fluid space 10c is formed between the inside of the rotary holder 8 and the concave portion 10a. A rotation support axis 8a extends from an axial portion of the rotary holder 8, and is inserted into the substrate table 10 through the concave portion 10a. The rotation support axis 8a is rotatably supported in the substrate table 10 by a bearing 8b to provide a circulate gap shown in FIG. 1. to permit the circumfusing of the fluid to each chamber of the rotary holder 8.

Figure 2:
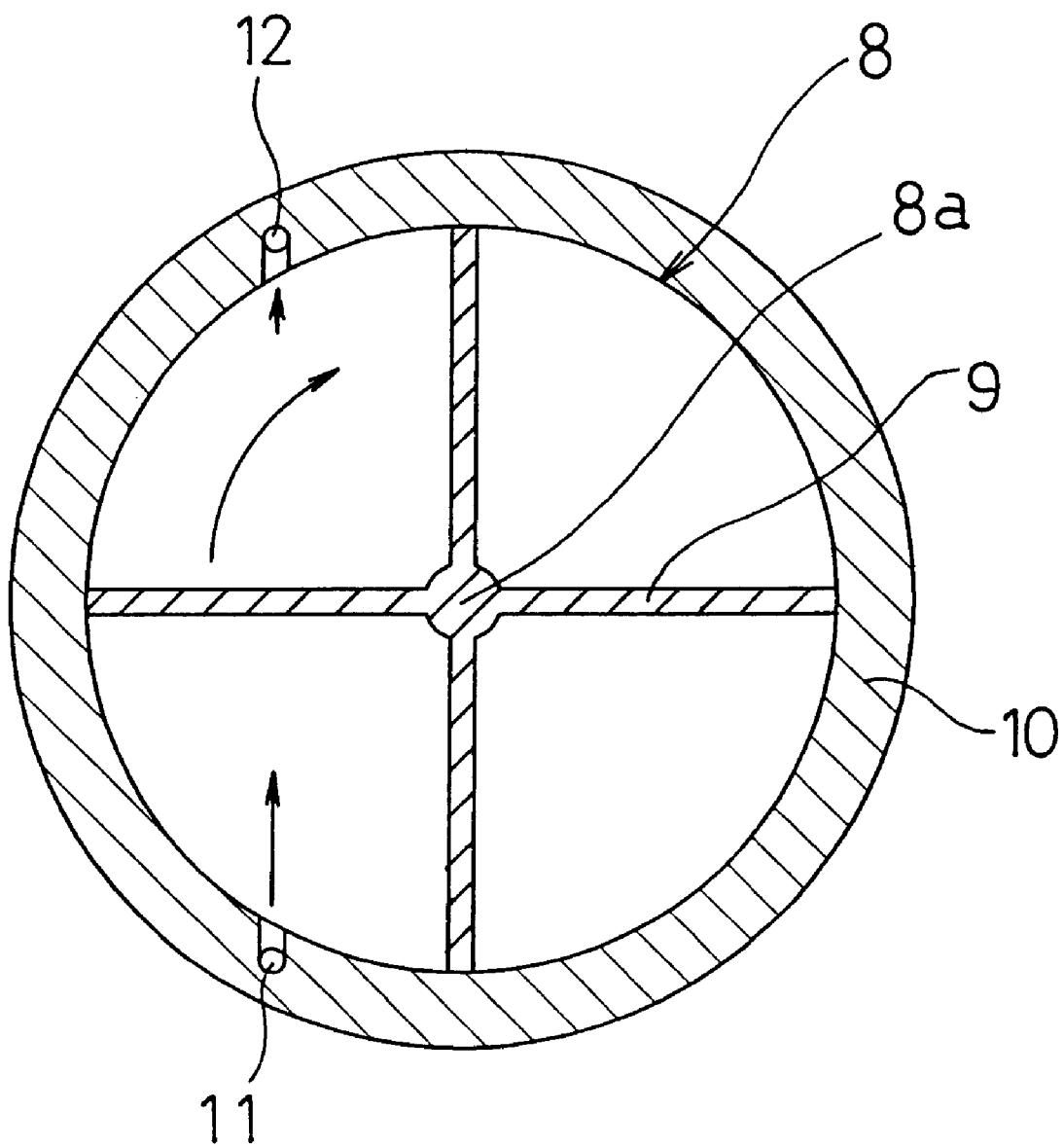
FIG. 2 is a cross-sectional view taken along the line II—II in FIG. 1, seen in the direction of the arrows.
Figure 3:
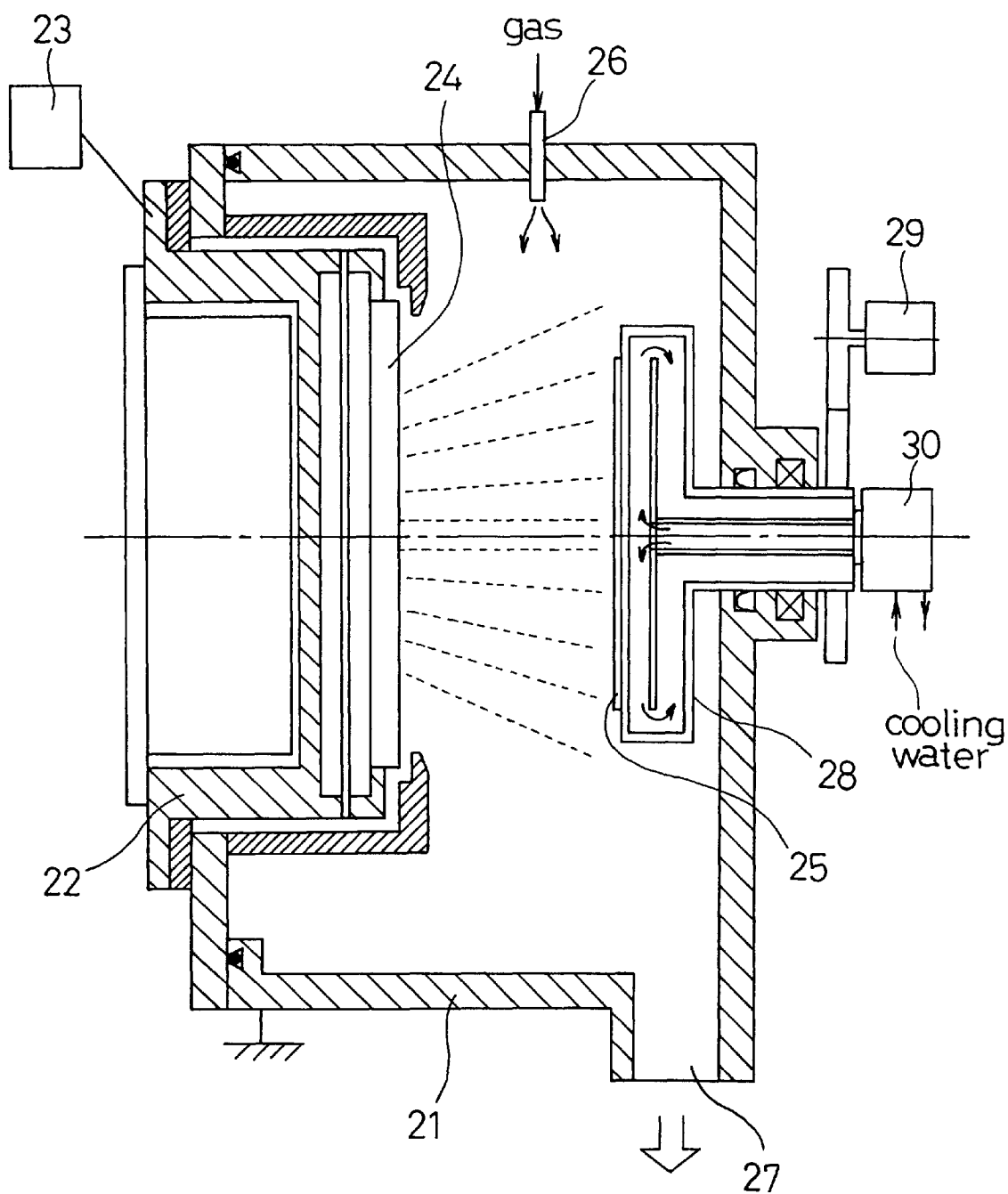
FIG. 3 is a longitudinal cross-sectional view showing the general configuration of a conventional sputtering apparatus.

Inside the rotary holder 8 are provided blades 9, which radiate from the perimeter of the rotation support axis 8a, as shown in FIG. 2. The substrate table 10 is provided with a supply port 11 and a drainage port 12, an end of which opens on the outer face of the vacuum chamber 1 and the other end of which opens into the fluid space 10c. Cooling water or He gas is supplied through the supply port 11 into the fluid space 10c, and in so doing exerts a rotation force onto the blades 9 inside the rotary holder 8, subsequent to which the aforementioned cooling water or He gas is drained through the drainage port 12.

The target 4 is pressed against the cathode portion 2 by a target holder 13 via a water-cooled plate 14, so that the target 4 is cooled by cooling water 15. The vacuum chamber 1 is on ground potential and is insulated from the cathode portion 2 by an insulating material 16. Numeral 17 denotes a ground shield, and numeral 18 denotes a magnet.

The supply port 11 is provided with a device for adjusting the supply pressure and supplied flow volume of cooling water or He gas (not shown in the drawings).

The sputtering apparatus with the above configuration is operated as described below. First, after the inside of the vacuum chamber 1 has been evacuated to a predetermined degree, a plasma-generating gas such as argon gas is introduced into the vacuum chamber 1 through the gas inlet portion 6 and is at the same time exhausted from the vacuum chamber 1 through the exhaust port 7 to attain a predetermined sputtering pressure.

When in this state a high frequency or DC voltage is applied to the cathode portion 2 with the power source 3, a plasma is generated between the substrate 5 and the target 4. The magnetic field that is formed by the magnet 18, causes the argon ions in the plasma to accelerate and collide with the target 4, so that target material gets knocked out of the target and propelled into the vacuum, after which it adheres to the substrate 5, forming a thin film.

In the meantime, cooling water or He gas is introduced from the supply port 11 of the substrate table 10 into the fluid space 10c. The cooling water or He gas exerts a rotation force on the blades 9 and is drained through the drainage port 12 after causing the rotary holder 8 to rotate. The substrate 5 is cooled effectively by the fluid that flows through the interior of the rotary holder 8 including the circulate gap. Thus, as the substrate 5, which is mounted on the rotary holder 8, is caused to rotate while being cooled, target material is caused to adhere to the substrate 5, forming a thin film on the substrate 5.

According to the present embodiment, as detailed in the foregoing, the rotation motor and cooling water inlet unit that are necessary in the conventional example can be omitted, so that the sputtering apparatus can be made smaller and simpler.

Furthermore, by adjusting the pressure and the amount of the cooling water or He gas that is supplied, the rotating speed of the substrate 5 can be adjusted as desired, so that the film thickness distribution and other parameters can be controlled easily.

The above embodiment has been described for a sputtering apparatus, but the present invention can be applied effectively to any plasma processing apparatus in which a substrate is rotated while being cooled.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A plasma sputtering method wherein a sputtering target is placed on a cathode in a vacuum chamber, and a substrate is arranged on a holder in opposition to the sputtering target, to perform sputtering, the holder is operatively connected to a multi-chamber blade member mounted in a cavity and offset from a surface of the cavity to provide a circulate gaps, an input fluid connector for introduction of fluid to the cavity and an exit fluid connector for removing the fluid, comprising the steps of:

introducing a fluid from the input fluid connector into an interior space formed in said holder on which the substrate is arranged in such a manner that the circulate gap provides a circumfusing of the fluid to each chamber of the blade member to enhance a cooling effect; and apply a fluid pressure through the input fluid connector and releasing the fluid through the exit fluid connector such as to exert a motive force to the holder to rotate, wherein the fluid is continuously drained after flowing through the interior space of the holder, whereby the substrate is cooled as being rotated.

2. The plasma sputtering method of claim 1 further including adjusting the fluid pressure to control the rotation of the holder.

3. The plasma sputtering method of claim 1 wherein the fluid is water.

4. The plasma sputtering method of claim 1 wherein the fluid is He gas.

5. In a sputtering apparatus for sputtering material from a sputtering target onto an object in a sputtering chamber, an improvement comprising:

a movable holder for supporting the object within the sputtering chamber having a housing with a cavity, a rotary holder mounted within the cavity for rotation, and a multi-chamber blade member connected to the rotary holder and offset from the housing to provide a circulate gap above one surface of the cavity;

an input fluid connector for introducing a fluid to contact a chamber of the blade member on a first side of the cavity; and an exit fluid connector on another side of the cavity for removing the fluid after contact with the chamber of the blade member whereby the fluid can drive the rotary holder and cool the object by exchanging heat with the fluid, the circulate gap providing a circumfusing of the fluid to each chamber of the blade member to enhance the cooling effect.

6. A plasma processing apparatus for generating a plasma in a vacuum chamber to perform surface processing of a substrate that is arranged inside the vacuum chamber, the plasma processing apparatus comprising:

a substrate table that extends from a wall of said vacuum chamber toward the inside of said vacuum chamber;

a rotary holder, on which the substrate is placed, wherein said rotary holder is arranged in a concave portion that is provided in said substrate table; said rotary holder is rotatably supported with its periphery being sealed;

a multi-chamber blade member connected to the rotary holder and offset from the housing to provide a circulate gap above one surface of the concave portion; and ports for supplying and draining a fluid, such that a rotation force can be exerted on the blade, are formed in the substrate table whereby the fluid can drive the rotary holder and cool the substrate by exchanging heat with the fluid, the circulate gap providing a circumfusing of the fluid to each chamber of the blade member to enhance the cooling effect.

7. The plasma processing apparatus according to claim 6, wherein a device is installed for adjusting the pressure and amount of the fluid.

8. The plasma processing apparatus according to claim 6, wherein the fluid is cooling water.

9. The plasma processing apparatus according to claim 6, wherein the fluid is He gas.

10. The plasma sputtering apparatus according to claim 6, wherein a sputtering target is placed on a cathode portion in said vacuum chamber, and a substrate is arranged in opposition to the sputtering target, to perform sputtering.

11. A plasma processing method wherein surface processing is performed to a substrate that is arranged on a holder within a vacuum chamber, the holder being operatively connected to a multi-chamber blade member, which is mounted in a cavity such as to be offset from a surface of the cavity to provide a circulative gap, comprising the procedures of;

introducing a fluid from an input fluid connector into an interior space formed in said holder in such a manner that the circulate gap provides a circumfusing of the fluid to each chamber of the blade member to enhance a cooling effect; and applying a fluid pressure through the input field connector and releasing the fluid through an exit fluid connector such as to exert a motive force to the holder to rotate, wherein the fluid is continuously drained after flowing through the interior space of the holder, whereby the substrate is cooled as being rotated.

12. In an apparatus for sputtering material from a sputtering target onto an object in a vacuum chamber, an improvement comprising:

a movable holder for supporting the object within the vacuum chamber;

a cavity formed within the movable holder;

a rotary holder mounted within the cavity for rotation;

a multi-chamber blade member connected to the rotary holder and offset from a surface of the cavity to provide a circulate gap;

an input fluid connector for introducing a fluid to contact a chamber of the blade member on a side of the cavity; and an exit fluid connector on another side of the cavity for removing the fluid.

* * * * *